US007951451B2

(12) United States Patent
Rancien

(10) Patent No.: US 7,951,451 B2
(45) Date of Patent: May 31, 2011

(54) SELF-ADHESIVE DOCUMENT INCORPORATING A RADIOFREQUENCY IDENTIFICATION DEVICE

(75) Inventor: Sandrine Rancien, La Murette (FR)

(73) Assignee: Arjo Wiggins Security SAS, Issy les Moulineaux (FR)

( * ) Notice: Subject to any disclaimer, the term of this patent is extended or adjusted under 35 U.S.C. 154(b) by 0 days.

(21) Appl. No.: 10/472,559

(22) PCT Filed: Apr. 3, 2002

(86) PCT No.: PCT/FR02/01152
§ 371 (c)(1),
(2), (4) Date: Dec. 15, 2003

(87) PCT Pub. No.: WO02/082126
PCT Pub. Date: Oct. 17, 2002

(65) Prior Publication Data
US 2004/0157054 A1 Aug. 12, 2004

(30) Foreign Application Priority Data
Apr. 5, 2001 (FR) .................................. 01 04637

(51) Int. Cl.
*B32B 7/12* (2006.01)
*B32B 3/00* (2006.01)
*B32B 3/26* (2006.01)

(52) U.S. Cl. ....... 428/343; 428/354; 428/40.1; 428/914; 428/915

(58) Field of Classification Search .................. 428/40.1, 428/343, 354, 915, 916; 361/748, 749
See application file for complete search history.

(56) References Cited

U.S. PATENT DOCUMENTS

| 4,121,003 A | * | 10/1978 | Williams ..................... 428/42.1 |
| 4,763,931 A | * | 8/1988 | Matsuguchi et al. ......... 283/108 |
| 4,929,928 A | * | 5/1990 | Hultaker .................... 340/572.3 |
| 5,763,058 A | | 6/1998 | Isen et al. |
| 5,949,059 A | | 9/1999 | Rawson, Sr. et al. |
| 6,094,133 A | | 7/2000 | Shimamura et al. |
| 6,094,138 A | * | 7/2000 | Eberhardt et al. ......... 340/572.1 |
| 6,100,804 A | * | 8/2000 | Brady et al. ............... 340/572.7 |
| 2002/0036237 A1 | * | 3/2002 | Atherton et al. .............. 235/492 |

FOREIGN PATENT DOCUMENTS

| EP | 1 271 398 A1 | 1/2003 |
| JP | A 2001-013874 | 1/2001 |
| WO | WO 99/21133 * | 4/1999 |
| WO | WO 01/71848 A1 | 9/2001 |
| WO | WO 02/077939 A | 10/2002 |
| WO | WO 02/095655 A2 * | 11/2002 |

OTHER PUBLICATIONS

Takeda, Hiroshi et al., "ID Label", English translation of JP 2001-013874, Jan. 19, 2001.*
Merriam-Webster Online Dictionary definition of "delamination", pp. 1-2. Retrieved Jul. 24, 2009.*
Roy Want, "An Introduction to RFID Technology", IEEE Pervasive Computing, pp. 25-33, 2006.*

* cited by examiner

*Primary Examiner* — Callie E Shosho
*Assistant Examiner* — Anish Desai
(74) *Attorney, Agent, or Firm* — Oliff & Berridge, PLC

(57) ABSTRACT

The invention relates to a sticky document. The document comprises an adhesive layer and at least one covering layer covering the adhesive layer, the covering layer incorporating a radiofrequency identification device, and at least a portion of the identification device being linked to the document with a force of cohesion that is weak enough to ensure that once the document has been stuck onto backing, and in the event of the document being unstuck, at least a portion of the identification device remains secured to the backing.

10 Claims, 1 Drawing Sheet

SELF-ADHESIVE DOCUMENT INCORPORATING A RADIOFREQUENCY IDENTIFICATION DEVICE

The present invention relates to the field of sticky documents or "stickers" and more particularly to a sticky security document such as a visa for sticking to a passport.

BACKGROUND OF THE INVENTION

At present, sticky visas are made using lightweight paper so that if an attempt is made to unstick them, the paper delaminates.

Proposals have been made to associate security documents with radiofrequency identification devices (RFIDs).

Such radiofrequency identification devices further increase security by making falsification more difficult and by increasing the quantity of information made available to authorities during an inspection.

OBJECTS AND SUMMARY OF THE INVENTION

A particular object of the present invention is to improve the security of sticky documents provided with radiofrequency identification devices.

This is achieved by means of a novel sticky document, comprising an adhesive layer and at least one covering layer covering the adhesive layer, the covering layer incorporating a radiofrequency identification device, and at least a portion of the identification device being linked to the document with a force of cohesion that is weak enough to ensure that once the document has been stuck onto backing, and in the event of the document being unstuck, at least a portion of the identification device remains secured to the backing.

The term "document" is used to mean any type of relatively thin and flexible structure, possibly capable of acting as a printing or writing medium, such as a visa or a label for guaranteeing the authenticity of an article or for showing its price.

By means of the invention, it is possible to make a sticky document by using relatively heavy paper that is capable of protecting the radiofrequency identification device and that makes it possible to provide a document of substantially constant thickness. In spite of it being easier to unstick the document because of the heavier grade of paper constituting the covering layer, security is not diminished.

Because of the invention it is therefore possible to use paper of weight that is considerably greater than that used in conventional sticky security documents without that making the task any easier for counterfeiters.

It is possible to use various types of radiofrequency identification device, in particular identification devices having an antenna integrated in the chip or identification devices having an external antenna, e.g. made by printing on one of the layers making up the document.

Making an antenna of relatively large dimensions by means of a conductive ink, for example, serves to increase the range of the radio link between the identification device and the reading and/or writing apparatus.

Specifically in the case of the identification device having an antenna external to the chip, at least a portion of the antenna can adhere more strongly to the adhesive layer that is used for fixing the document to the backing than to the covering layer. Thus, by attempting to unstick the document, at least a portion of the antenna remains secured to the backing.

It is also possible to make the link between the chip and the antenna in such a manner that adhesion of the antenna to the backing is stronger than the connection between the antenna and the chip such that in the event of an attempt to unstick the document, the connection between the chip and its antenna is damaged, with the chip remaining secured to the covering layer, for example.

When the antenna is made by printing a conductive ink, it is possible for the binder of the ink to be selected in such a manner that the cohesion force of the ink is lower than the force of adhesion between the ink and the covering layer. Thus, in the event of an attempt at unsticking the document, the antenna is damaged, a portion of the antenna remaining secured to the backing and another portion of the antenna remaining secured to the covering layer. The conductive ink can include conventional tamperproofing agents, providing they are compatible with the ink.

The antenna can have a predetermined rupture zone to facilitate damage to the antenna in the event of an attempt at unsticking the document from the backing.

For example, the predetermined rupture zone may be a thin zone of the antenna.

In different zones, the adhesive layer may present different adhesive properies with regard to the antenna. For example, the force of adhesion of the antenna to the adhesive layer situated in a first zone may be weaker than the force of adhesion of the antenna to the covering layer, and the force of adhesion of the antenna to the adhesive layer situated in a second zone may be stronger than the force of adhesion of the antenna to the covering layer.

Thus, when attempting to unstick the document, the antenna may remain secured to the covering layer in the first zone and remain secured to the backing in the second zone.

BRIEF DESCRIPTION OF THE DRAWING

The invention will be better understood on reading the following description of non-limiting embodiments, and on examining the accompanying drawing, in which.

MORE DETAILED DESCRIPTION

Figure 1:
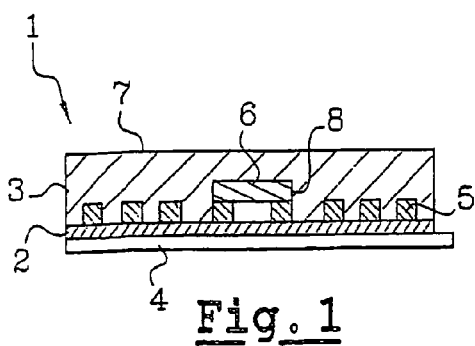
FIG. 1 is a diagrammatic section through a sticky security document constituting an embodiment of the invention.
Figure 2:
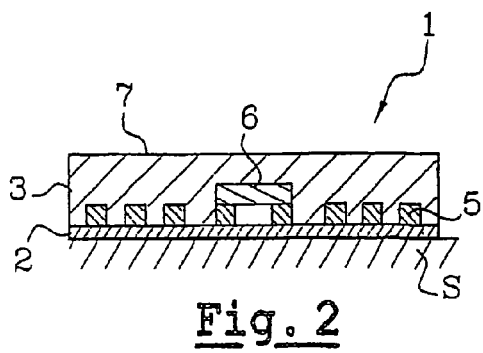
FIG. 2 shows the FIG. 1 document stuck on backing.

FIG. 1 shows a sticky security document 1 such as an adhesive visa for placing in a passport S, the document having an adhesive layer 2, a covering layer 3, and a removable protective film 4 covering the adhesive layer 2 before the document 1 is stuck to backing S, e.g. a page in a passport, as shown in FIG. 2.

An antenna 5 is made on the adhesive layer 2 by printing with a conductive ink.

The antenna 5 is connected to a chip 6 so as to constitute a radiofrequency identification device (RFID). As further illustrated by the example of FIG. 1, the antenna 5 and the chip 6

(i.e., radiofrequency identification device (RFID)) extend on only one face of the covering layer 3 (i.e., bottom face). In other words, the antenna 5 and the chip 6 are not illustrated on another face of the covering layer 3.

In the example described, the covering layer 3 has an outside face 7 that is printable.

The thickness of the covering layer 3 is greater than that of the chip 6 so as to protect it.

A cavity 8 is formed in the covering layer 3 to house the chip 6 and to enable the sticky security document 1 to retain substantially constant thickness without any significant extra thickness over the radiofrequency identification device.

The covering layer 3 can be of multilayer structure.

In accordance with the invention, any attempt by a counterfeiter at unsticking the document 1 from its backing S will damage the radiofrequency identification device. In a variant the device remains secured to the backing S, and only the covering layer 3 is removed.

Figure 3:
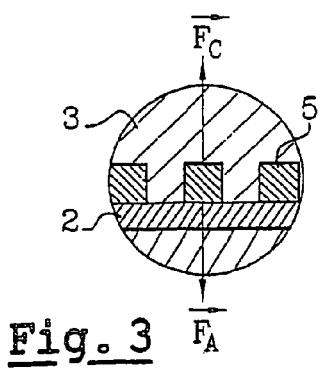
FIG. 3 is a diagrammatic view illustrating the fact that the force of adhesion of the antenna to the backing is stronger than the force of adhesion of the antenna to the covering layer.
Figure 4:
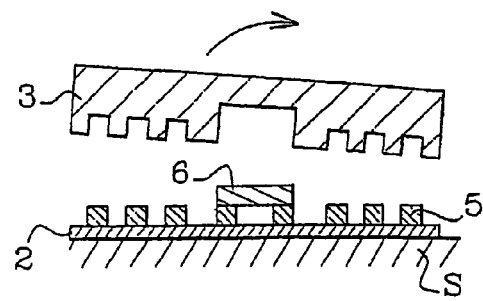
FIG. 4 shows the covering layer being detached with the antenna remaining secured to the backing.

A first way of damaging the identification device in the event of an attempt at unsticking is shown in FIGS. 3 and 4, and it consists in selecting an adhesive for constituting the adhesive layer 2 in such a manner that the force of adhesion $F_a$ between the antenna and the adhesive layer 2 is stronger than the force of adhesion $F_c$ between the antenna and the covering layer 3. Thus, if an attempt is made to unstick the document 1, the antenna 5 remains secured to the backing S, as shown in FIG. 4.

It is also possible to make the adhesive layer 2 in such a manner that it presents a first portion 2a presenting adhesion properties relative to the antenna 5 that are different from the properties of a second portion 2b.

In particular, the adhesive layer 2 can receive treatment over a fraction of its surface so as to present adhesion properties that are not uniform.

Figure 5:
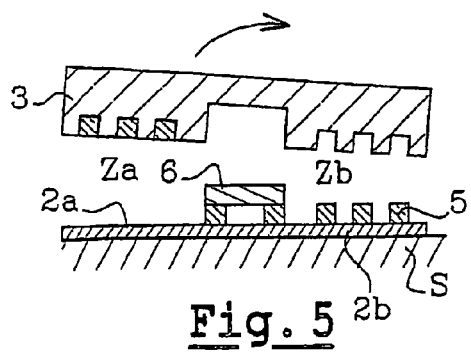
FIG. 5 shows a variant embodiment illustrating the covering layer being detached, a portion of the antenna remaining secured to the backing and a portion of the antenna remaining secured to the covering layer.

In the example of FIG. 5, the force of adhesion between the antenna 5 and the portion 2a situated in the zone Za is less than the force of adhesion between the antenna 5 and the covering layer 3, while in the zone Zb, the force of adhesion between the antenna 5 and the portion 2b is greater than the force of adhesion between the antenna 5 and the covering layer 3.

In a variant (not shown), the covering layer 3 is made in such a manner that the adhesion between the covering layer 3 and the antenna 5 is non-uniform so that in the event of an attempt at removing the covering layer 3 a portion of the antenna 5 remains secured to the backing S, thereby damaging the radiofrequency identification device.

Figure 6:
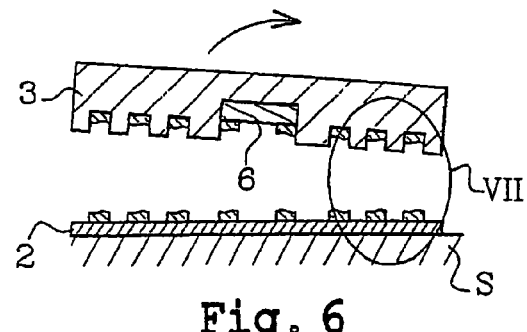
FIG. 6 shows the covering layer being removed when the force of cohesion of the ink is less than the force of adhesion between the ink and the adhesive layer and the force of adhesion between the ink and the covering layer.
Figure 7:
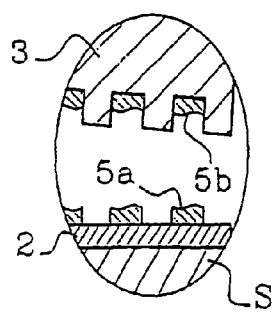
FIG. 7 shows a detail of FIG. 6.

It is also possible to choose a binder for the conductive ink used to make the antenna 5 in such a manner that the force of cohesion of the ink is weaker than the force of adhesion between the ink and the adhesive layer 2 and the force of adhesion between the ink and the covering layer 3. Thus, as shown in FIG. 6, in the event of the covering layer 3 being removed, the adhesive layer 2 remains on the backing S, and the electrical conductors formed by depositing the conductive ink are split into portions 5a that remain secured to the backing and portions 5b that remain secured to the covering layer 3.

The weak cohesion force of the ink can also give rise to the turns of the antenna being broken at one or more points.

Naturally, the security document 1 can be given a structure other than that shown in FIG. 1.

Figure 8:
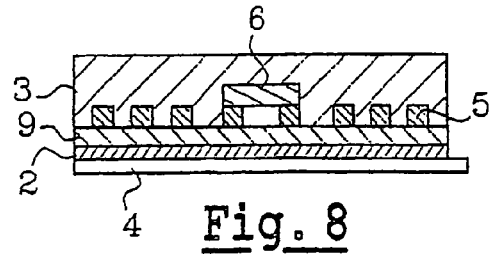
FIG. 8 shows a variant embodiment of the sticky security document.

By way of example, it is possible in particular to make the antenna 5 by printing a conductive ink not on the adhesive layer but on an intermediate layer 9 situated between the adhesive layer 2 and the covering layer 3, as shown in FIG. 8.

Under such circumstances, the adhesive is selected in such a manner, for example, that in the event of an attempt at unsticking, a portion of the antenna 5 remains secured to the intermediate layer 9 which remains held on the backing S by the adhesive layer 2.

Figure 9:
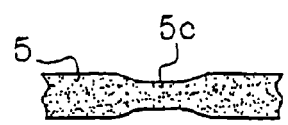
FIG. 9 shows how a predetermined rupture zone is formed in the antenna.

The antenna 5 can be made, for example, to have at least one thin zone 5c as shown in FIG. 9, thereby promoting antenna damage in the event of an attempt at unsticking the document.

What is claimed is:

1. A document comprising:
   a paper layer comprising a cavity,
   a radiofrequency identification device on the paper layer, the radiofrequency identification device comprising a chip located within the cavity and a conductive ink antenna, adhering to the paper layer, and
   an adhesive layer in contact with the radiofrequency identification device, said adhesive layer enabling adhesion of the document to a backing and ensuring that, upon removal of the document from the backing, at least one portion of the antenna separates from another portion of the antenna and remains adhering to the backing, the adhesive layer consisting of a single layer of adhesive.

2. The document according to claim 1, wherein the antenna is located outside the chip.

3. The document according to claim 1, wherein the antenna has at least one portion adhering more strongly to the adhesive layer than to the paper layer.

4. The document according to claim 1, wherein the chip and the antenna are connected via a connection, the adhesion between the antenna and the backing causing the connection between the chip and the antenna to be damaged during removal of the document from the backing.

5. The document according to claim 1, wherein the ink further comprises tamperproofing agents.

6. The document according to claim 1, wherein the antenna comprises at least one thin zone configured to be broken during removal of the document from the backing.

7. The document according to claim 1, the document having a constant thickness in an area wherein the radiofrequency identification device is located.

8. The document according to claim 1, configured such that the antenna is damaged during removal of the document from the backing.

9. The document according to claim 1, wherein the conductive ink has a force of cohesion weaker than a force of adhesion between the ink and the paper layer.

10. A document comprising:
    a covering layer,
    a radiofrequency identification device located entirely in a cavity of the covering layer, the device being exposed on one face only of the covering layer and comprising an antenna, and
    an adhesive layer extending over the covering layer and in direct contact with the radiofrequency identification device on the one face only, the adhesive layer providing adhesion of the document onto a backing, at least a portion of the antenna having a force of cohesion that is weak enough to ensure that, once the document is adhering to the backing and in the event of the document being removed from the backing, at least one portion of the antenna separates from another portion of the antenna and remains adhering to the backing, the adhesive layer consisting of a single layer of adhesive.

* * * * *